United States Patent
Brost et al.

(10) Patent No.: US 7,233,128 B2
(45) Date of Patent: Jun. 19, 2007

(54) CALCULATION OF STATE OF CHARGE OFFSET USING A CLOSED INTEGRAL METHOD

(75) Inventors: Ron Brost, Dearborn, MI (US); Bruce Blakemore, Washtenaw, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 364 days.

(21) Appl. No.: 10/903,314

(22) Filed: Jul. 30, 2004

(65) Prior Publication Data

US 2006/0022643 A1    Feb. 2, 2006

(51) Int. Cl.
*H02J 7/00* (2006.01)
*H02H 7/06* (2006.01)

(52) U.S. Cl. ..................... 320/132; 361/20
(58) Field of Classification Search ............ 320/132, 320/119, 104; 361/20
See application file for complete search history.

(56) References Cited

U.S. PATENT DOCUMENTS

| | | | |
|---|---|---|---|
| 5,808,445 A | 9/1998 | Aylor et al. | |
| 6,275,008 B1 | 8/2001 | Arai et al. | |
| 6,285,163 B1 * | 9/2001 | Watanabe et al. | 320/132 |
| 6,356,083 B1 * | 3/2002 | Ying | 324/426 |
| 6,359,419 B1 * | 3/2002 | Verbrugge et al. | 320/132 |
| 6,388,447 B1 | 5/2002 | Hall et al. | |
| 6,608,482 B2 | 8/2003 | Sakai et al. | |
| 6,629,027 B2 | 9/2003 | Yamaguchi et al. | |
| 6,646,421 B2 | 11/2003 | Kimura et al. | |
| 2002/0113595 A1 * | 8/2002 | Sakai et al. | 324/433 |
| 2002/0196026 A1 * | 12/2002 | Kimura et al. | 324/426 |
| 2003/0074115 A1 | 4/2003 | Yamaguchi et al. | |

FOREIGN PATENT DOCUMENTS

JP    02002315211    10/2002

* cited by examiner

*Primary Examiner*—Gary L Laxton
*Assistant Examiner*—Yalkew Fantu
(74) *Attorney, Agent, or Firm*—David B. Kelley; Tung & Associates

(57) ABSTRACT

A state of charge control system and method uses a region of voltage linearity and a long-term average voltage to estimate an average battery state of charge for storage batteries and to eliminate errors due to hysteresis, drift and sensor noncompliance. An average state of charge Sn is calculated using a current integral method and an average state of charge Sv based on an average observed voltage Vn for a time period exceeding a predefined minimum time but before a predefined maximum time has elapsed is also calculated. If the absolute value of the difference between the Sv and Sn are not are within an acceptable error band, then an offset value is calculated to correct the Sn by subtracting the Sv from the Sn, and thus, to maintain a more accurate Sn. Additionally, a closed current integral method is used to reduce errors due to hysteresis.

22 Claims, 2 Drawing Sheets

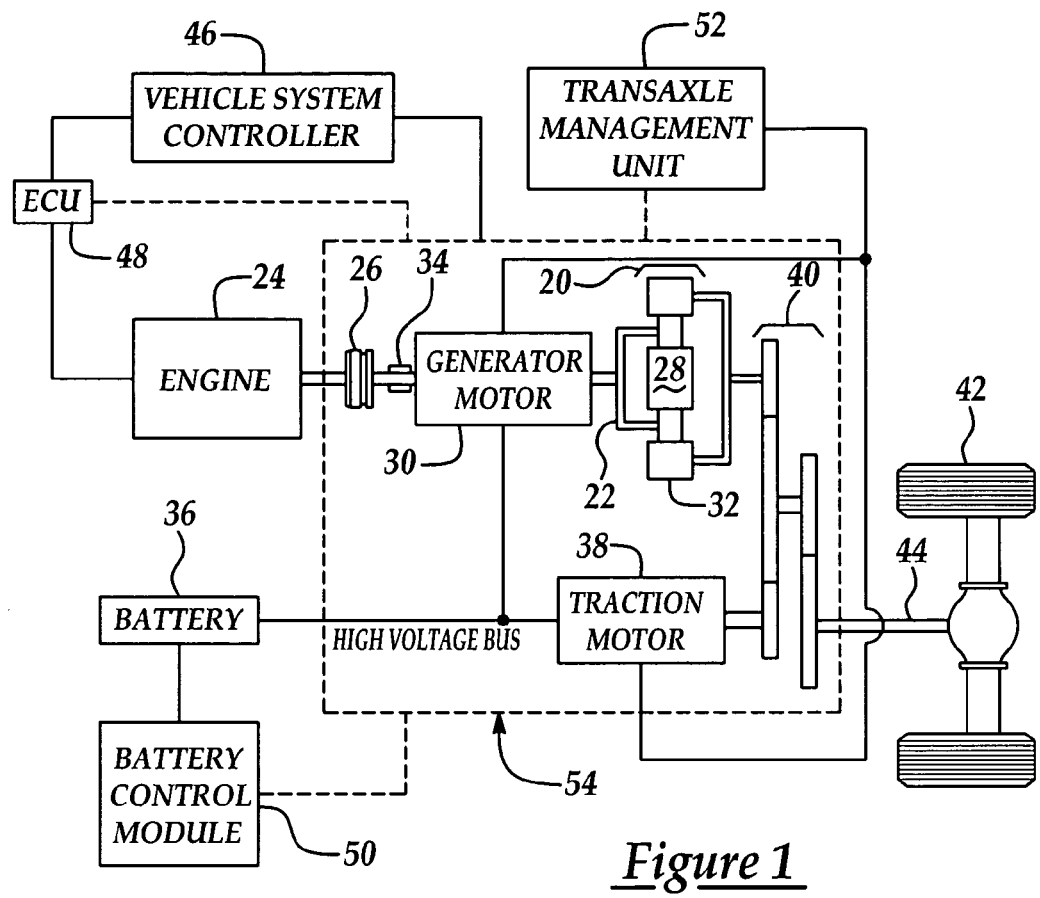
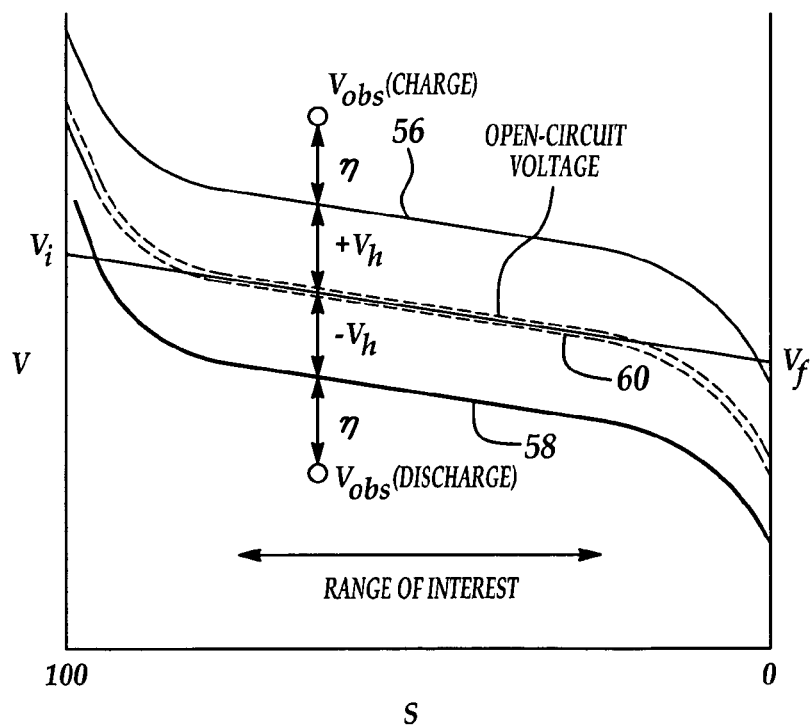
Figure 1
Figure 2

CALCULATION OF STATE OF CHARGE OFFSET USING A CLOSED INTEGRAL METHOD

FIELD OF THE INVENTION

The present invention relates generally to a battery control method for hybrid vehicles, and more particularly to a state-of-charge determining method of determining a state-of-charge of a storage battery installed in a hybrid vehicle accurately.

BACKGROUND OF THE INVENTION

The need to reduce fossil fuel consumption and emissions in automobiles and other vehicles predominately powered by internal combustion engines (ICEs) is well known. Vehicles powered by electric motors attempt to address these needs. Another alternative solution is to combine a smaller ICE with electric motors into one vehicle. Such vehicles combine the advantages of an ICE vehicle and an electric vehicle and are typically called hybrid electric vehicles (HEVs).

The desirability of combining an ICE with electric motors is clear. There is great potential for reducing vehicle fuel consumption and emissions with no appreciable loss of vehicle performance or drive-ability. The HEV allows the use of smaller engines, regenerative braking, electric boost, and even operating the vehicle with the engine shutdown. Nevertheless, new ways must be developed to optimize the HEV's potential benefits.

An HEV can use batteries to store electrical energy for use by the vehicle's electric motor. Active control of the HEV battery becomes a critical vehicle function to achieve the HEV goals of reduced emissions and fuel economy. Such active battery control cannot only increase overall vehicle performance and fuel economy but also increase battery life.

Typical batteries installed in the hybrid vehicles are discharged during a high-load operation such as acceleration and recharged during a low-load operation such as traveling at constant speed or deceleration. In order to carry out such discharging and recharging effectively, it is important to keep SOC (State Of Charge which is also referred to as an available reserve capacity or residual electric energy) at a middle value (e.g., 50% to 70% of a fully charged energy of a battery). It is, thus, essential to monitor the SOC of the storage battery.

As a method of measuring the SOC, there is known a technique for integrating or totalizing the amount of current discharged from a storage battery. This technique, however, encounters a drawback in that errors in totalizing the discharged current are accumulated due to a variation in charging/discharging efficiency, thus making it difficult to measure the amount of reserve current in the battery accurately. In order to avoid this problem, Japanese Patent First Publication No. 2000-69606 proposes a correction system designed to correct the charging/discharging efficiency as a function of a difference between an actual state of charge and an estimated state of charge of a storage battery. The actual state of charge is determined by an upper or a lower limit of a voltage-to-current characteristic stored in a memory of the system when it is reached. The estimated state of charge is determined by a totalized amount of current discharged from the battery. The system, however, has a problem in that it is difficult to eliminate the totalizing error completely because of a change in charging/discharging efficiency arising from the history of use of the battery.

Battery availability and life in hybrid applications are highly dependent on proper management of the battery state of charge. Current methods using principally current integration, is not robust to sensor noncompliance, memory effect, battery age, or temperature. In addition, vehicle testing has demonstrated that lookup tables are not robust to any of hysteresis, memory effect, battery age, temperature, or sensor noncompliance. Improper state of charge management can lead to accelerated cell degradation, degraded vehicle performance requirements and inadequate overcharge or over-discharge protection.

Battery state of charge (SOC) controls for vehicles are known in the prior art using various conditions or criteria. U.S. Pat. No. 6,629,027 to Yamaguchi et. al. detects a state of charge from an integral of a voltage with respect to time and obtains an electric power output. Additionally, U.S. Pat. No. 6,091,228 to Chady et al. uses current integration and produces a signal source representing the desired auxiliary source current.

However each of the existing battery SOC controls do not calculate a state of charge based on a linear region of an average open-circuit voltage that operates to eliminate the effects of hysteresis and internal battery resistance.

Therefore it is desirable to provide a control system and method that corrects a current-based state of charge calculated by providing an offset correction value based on an average open circuit voltage that operates to eliminate SOC calculation errors caused by sensor drift, sensor noncompliance, hysteresis, and effects of battery age.

SUMMARY OF THE INVENTION

The present invention provides a method to control battery state of charge (SOC) for electrical charge storage devices such as storage batteries installed in an electric vehicle, and specifically a voltage-based state-of-charge determining method that offsets a current-based state of charge to correct for inaccuracies associated with hysteresis, internal battery resistance, sensor noncompliance, sensor drift, and battery age.

The present invention provides a state of charge control method that uses a region of voltage linearity and a long-term average voltage to estimate an average battery state of charge for at least one and preferably, a plurality of battery charge-discharge cycles that occur during at least one hybrid cycle, which can then be used to check for accuracy of the more dynamic (but subject to drift) amp-hour integration method.

More particularly, in a preferred embodiment of the present invention, a method is provided to calculate an accurate state of charge of a battery installed in an electric vehicle, the method has the step of using an estimated average battery state of charge for electric vehicles based on a long-term average open circuit battery voltage to check for accuracy of a measured state of charge based on current flowing into and out of the battery.

The method has additional steps that include extrapolating an initial voltage value from the region of voltage linearity to a full state of charge; extrapolating a final voltage value from the region of voltage linearity to an empty state of charge when the battery is completely discharged; and using the extrapolated initial and final voltage values to calculate the estimated average battery state of charge for hybrid cycles based on a long-term average open circuit voltage of the battery.

Additionally, in accordance with a preferred embodiment of the present invention, a compensation factor is provided to correct for variations in battery charge caused by temperature.

An alternative method provides the step of calculating an offset value between a voltage-based average battery state of charge $Sv_{avg}$ based on an average open circuit voltage and a current-based average state of charge $Sn_{avg}$ based on a summation of current flowing into and out of the battery when the two average battery state of charges $Sv_{avg}$ and $Sn_{avg}$ differ by an amount exceeding an acceptable error band.

In another alternative embodiment, a method is provided that has the steps of calculating an average open circuit voltage to eliminate effects of hysteresis voltages and polarization of the battery that occur during a hybrid cycle; using the average open circuit voltage to calculate an average voltage-based state of charge of the battery, comparing the calculated average voltage-based state of charge with a current-based average state of charge measured from current flowing into and out of the battery; and correcting the current-based average state of charge when the average voltage-based state of charge differs from the average state of charge measured from current flowing into and out of the battery by a predefined amount.

A final alternative embodiment of the method of present invention is provided, the method having the steps of calculating a current-based average state of charge, wherein the current-based average state of charge is calculated using a current integral method; calculating a voltage-based average state of charge, wherein the voltage-based average state of charge is based on an average observed voltage for a time period exceeding a predefined minimum time but before a predefined maximum time; comparing each of the calculated current-based and voltage-based average state of charges to determine if an absolute value of difference between the two respective average state of charges is within an acceptable error band; and offsetting the calculated average current-based state of charge by the difference between the two respective average state of charges when the acceptable error band is exceeded to provide a more accurate average current-based state of charge.

BRIEF DESCRIPTION OF THE DRAWINGS

These and other objects, features and advantages of the present invention will become apparent from the following detailed description and the appended drawings in which:

FIG. 1 is a system diagram of a HEV configuration.
FIG. 2 is a graphical illustration of a general response of an electrochemical cell.

DETAILED DESCRIPTION OF THE PREFERRED EMBODIMENTS

Figure 3:
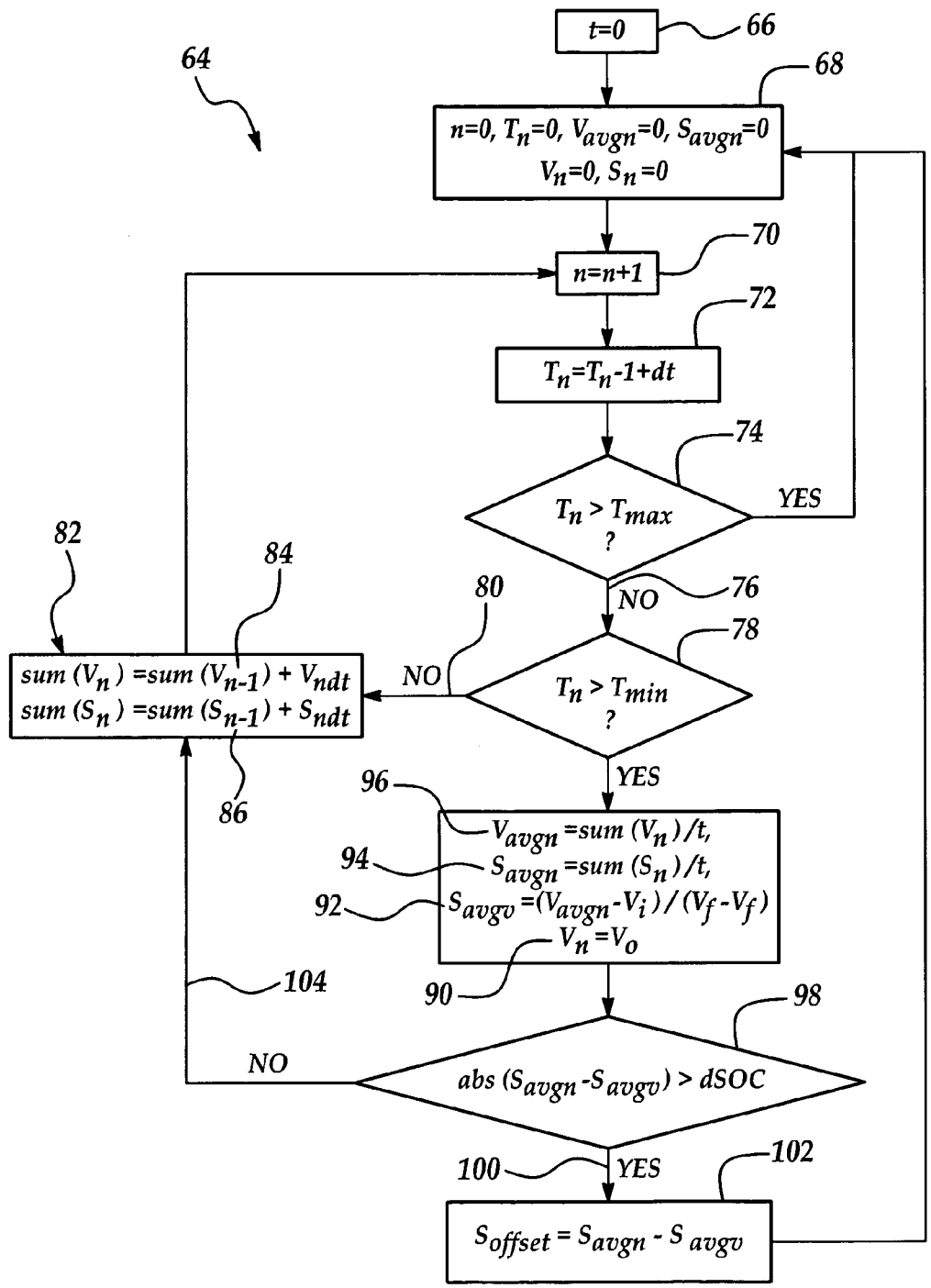
FIG. 3 is a flowchart depicting a method in accordance with a preferred embodiment of the present invention.

The present invention relates to battery control systems. Although the preferred embodiment describes using the invention in a hybrid electric vehicle, the present invention could be applied to any vehicle using a battery and means to charge the battery.

Generally disclosed is a method to control battery state of charge (SOC) for batteries installed in a vehicle, preferably, an electric vehicle such as a HEV. Specifically, a voltage-based state-of-charge determining method offsets a current-based state of charge to correct for inaccuracies associated with sensor noncompliance, sensor drift, and battery age.

A state of charge control method disclosed herein uses a region of voltage linearity and a long-term average voltage to estimate an average battery state of charge for at least one and preferably a plurality of battery charge-discharge cycles. Preferably, the battery charge-discharge cycles occur during at least one hybrid cycle. The average battery state of charge can then be used to check for accuracy of the more dynamic (but subject to drift) amp-hour integration method as described below.

Generally, the invention is directed to a calculation of a state of charge for an electrical charge storage device that has a means to charge the electrical charge storage device. Preferably, the electrical charge storage device is a battery used in an electric vehicle, wherein the electric vehicle may be selected from, but is not limited to a hybrid electric vehicle (HEV), an internal combustion engine vehicle, a fuel cell vehicle, and a hydraulic vehicle. More specifically, by using closed integration, the average battery state of charge can be determined over a region of voltage linearity. Basically, both a region of voltage linearity and a long-term average voltage is used to estimate an average battery charge state for the electric vehicle. The result is then used in an accuracy check of the more dynamic amp-hour integration method. A linear correction factor is used to compensate for the temperature effects on the open circuit voltage of the battery.

More particularly, in accordance with a preferred embodiment, the method of the present invention generally calculates an offset value between the average battery state of charge using an average open circuit voltage and an average state of charge calculated using a current integration method when the two average battery state of charges differ by an amount exceeding an acceptable error band.

Initially, an average state of charge Sn using the current integral method and calculates an average state of charge Sv based on an average observed voltage Vn for a time period exceeding a predefined minimum time but before a predefined maximum time. The two averages are compared to determine if an absolute value of differences between the Sv and Sn is within an acceptable error band dSOC. If the absolute value of the differences not are within the acceptable error band, then an offset value Soffset is calculated to correct the Sn by subtracting the Sv from the Sn to maintain a more accurate Sn.

To better understand the present invention, FIG. 1 illustrates a possible HEV configuration, specifically a parallel/series hybrid electric vehicle (powersplit) configuration. In this basic HEV configuration, a planetary gear set 20 mechanically couples a carrier gear 22 to an engine 24 via a one-way clutch 26. The planetary gear set 20 also mechanically couples a sun gear 28 to a generator motor 30 and a ring (output) gear 32. The generator motor 30 also mechanically links to a generator brake 34 and is electrically linked to a battery 36. A traction motor 38 is mechanically coupled to the ring gear 32 of the planetary gear set 20 via a second gear set 40 and is electrically linked to the battery 36. The ring gear 32 of the planetary gear set 20 and the traction motor 38 are mechanically coupled to drive wheels 42 via an output shaft 44.

The planetary gear set 20, splits the engine 24 output energy into a series path from the engine 24 to the generator motor 30 and a parallel path from the engine 24 to the drive wheels 42. Engine 24 speed can be controlled by varying the split to the series path while maintaining the mechanical connection through the parallel path. The traction motor 38 augments the engine 24 power to the drive wheels 42 on the parallel path through the second gear set 40. The traction motor 38 also provides the opportunity to use energy directly from the series path, essentially running off power created by the generator motor 30. This reduces losses associated with converting energy into and out of chemical energy in the battery 36 and allows all engine 24 energy, minus conversion losses, to reach the drive wheels 42.

A vehicle system controller (VSC) 46 controls many components in this HEV configuration by connecting to each component's controller. An engine control unit (ECU) 48 connects to the engine 24 via a hardwire interface. The ECU 48 and VSC 46 can be based in the same unit, but are actually separate controllers. The VSC 46 communicates with the ECU 48, as well as a battery control module (BCM) 50 and a transaxle management unit (TMU) 52 through a communication network such as a controller area network (CAN) 54. The BCM 50 connects to the battery 36 via a hardwire interface. The TMU 52 controls the generator motor 30 and traction motor 38 via a hardware interface.

With these HEV system controllers in place, the vehicle can optimize overall performance and efficiency.

In any HEV, battery 36 SOC is a critical parameter for fuel economy. Electrical power requirements differ at different speeds while the battery 36 SOC is maintained within a certain range. If the same SOC is maintained during a vehicle speed range, the vehicle kinetic energy cannot be recaptured through regenerative braking since it can generate an undesirable SOC, degrading battery life and performance. As a result, the energy is wasted.

The general response of an electrochemical cell is shown in FIG. 2, wherein the X axis the state of charge ranging between 0 to 100 percent and the Y axis is the voltage. When the charge is zero, the voltage has a value of Vf, and when the state of charge is 100%, the voltage has a value of Vi.

As also shown in FIG. 2, $V_{obs}$ is an observed voltage, $V_o$ is an open-circuit voltage that is a function of both state of charge and temperature, $V_h$ is a hysteresis voltage of the $V_o$ having a positive value for charge and negative value for discharge, and η is a polarization that is a function of the battery current and internal resistance of the battery 36. $V_{obs}$ is equal to the sum of $V_o$, $V_h$, and η.

The $+V_h$ curve 56 having positive charge values is a hysteresis curve of the open-circuit voltage $V_o$ when the battery 36 is charged from an empty state of charge (SOC=0%) to a full state of charge (SOC=100%). The $-V_h$ curve 58 is a hysteresis curve of the open-circuit voltage Vo when the battery 36 is discharged from full state of charge (SOC=100%) to an empty state of charge (SOC=0%).

The value η is equal to a change in voltage for a given current dV/di, normally considered the internal resistance, multiplied by the battery current.

An average observed voltage is equal to an average open circuit voltage for a series of events at intervals Δt (dt) between t=0 and t=$t_{max}$ wherein, wherein $t_{max}$ is a long period of time within or during a completion of a hybrid cycle, wherein $t_{max}$ may be 4000 seconds and wherein dV/di constant.

In the special case of a hybrid vehicle battery use over a long period of time, it is assumed that the current flowing into and out of the battery 36 integrated with respect to time is closed, and thus, a closed integral of the current with respect to time is equal to zero as follows:

$$\oint i\, dt \approx \sum_0^t i\Delta t \approx 0$$

Additionally, an average hysteresis voltage is zero when the time spent during charge is approximately the same as the time spent at discharge, wherein the average hysteresis voltage is the sum of each of the hysteresis voltages with respect to time as follows:

$$\sum_0^t V_h \Delta t \approx 0$$

Initially, in accordance with a preferred method 64 of the present invention, a time t is set equal to zero (step 66). Next, a plurality of variables are initialized with respect to an integer n (step 68), wherein the variables are selected from a group of n, $t_n$, $V_n$, $\overline{V_n}$(Vavg$_n$), $S_n$, and $\overline{S_n}$(Savg$_n$), wherein n is a positive integer, $t_n$ represents a length of time in a hybrid cycle, wherein $V_n$ is $V_{obs}$ measured over an interval of time dt, $\overline{V_N}$ is an average of a sum of each of the voltages $V_n$ divided by a total length of time t, $S_n$ is a state of charge based on measured current flowing into and out of the battery with respect to an interval of time dt, $\overline{S_n}$ is an average of a sum of each of the current based charges $S_n$ with respect to a total time t. The variable n is incremented by one (step 70) each time a summation of each $V_n$ and $S_n$ occurs or after the step 68 of initializing the variables. A time $t_n$ is set equal to $t_{n-1}$ plus an interval in time dt (step 72), wherein $t_{n-1}$ is equal to a time from a previous calculation cycle. If $t_n$ is greater than (exceeds) a maximum time $t_{max}$ (determined in step 74), then, steps 68–72 are repeated until $t_n$ is not greater than $t_{max}$ (step 76).

After $t_n$ does not exceeds a maximum time $t_{max}$, a determination is made whether $t_n$ exceeds $t_{min}$ (step 78).

A sum of each $V_{obs}$ measured over an interval of time dt is totaled during a hybrid cycle (step 82) for each time $t_n$ exceeds a predefined minimum amount of time $t_{min}$ (step 80), but before $t_n$ exceeds $t_{max}$, wherein n is a positive integer that is incremented each time a summation step (step 82) occurs, wherein the summation step has the substeps of summation of $V_n$ and of $S_n$ (steps 84–86).

As shown in step 84 of FIG. 3, $V_{obs}$ is shown as $V_n$, and wherein $V_{n-1}$ represents an observed voltage from a previous interval of time.

Over a period of long period of time, for example, after 2000 seconds after a beginning of a hybrid cycle, wherein $t_n$ is greater than $t_{min}$ but less than $t_{max}$, the average hysteresis voltage over $t_n$ equals zero, and the current integrated with respect to time is zero, an average $V_{obs}$ ($\overline{V_{obs}}$, or $V_n$ as shown in FIG. 3) is equal to the average open circuit voltage ($\overline{V_o}$) (step 90) (see open circuit voltage curve 60 of FIG. 1) in accordance with the following formula.

$$\overline{V_{obs}} = \frac{\sum_0^t V_{obs}\Delta t}{t} = \frac{\sum_0^t V_o \Delta t}{t} + \frac{\sum_0^t V_h \Delta t}{t} + \frac{\frac{dV}{di}\sum_0^t i\Delta t}{t} = \overline{V_o}$$

-continued $$\overline{V_{obs}} = \frac{\sum_0^t V_{obs}\Delta t}{t} = \frac{\sum_0^t V_o \Delta t}{t} + 0 + 0 = \overline{V_o}$$

Thus, $\overline{V_{obs}} = \overline{V_o}$ (see step 90).

Thus, for a sufficiently long hybrid cycle, the average of the observed voltages $\overline{V_{obs}}$ will equal the average of the open circuit voltages $\overline{V_o}$ (step 90). Additionally, the average open-circuit voltage or observed voltage when calculated for a sufficiently long period of time (step 96) in the hybrid cycle has negligible hysteresis and internal battery resistance of the battery installed in the hybrid vehicle as shown using a summation of a plurality of observed voltages measured with respect to a predefined period of time developed across the battery.

Further, when operating in a region of voltage linearity of the $V_o$ curve (FIG. 2), the average open circuit voltage $\overline{V_o}$ correlates to the state of charge $S_v$ based on voltage shown in the equation:

$$\overline{V_o} = V_f + \overline{S_v}(V_i - V_f),$$

wherein $V_i$ and $V_f$ are the linear extrapolations of the open-circuit voltage curve 60 from a region of voltage linearity to 100% state of charge $S_v$ and 0% state of charge $S_v$, and wherein $\overline{S_v}$ (Savg$_v$) is the average state of charge of the open circuit voltage. Because $\overline{V_{obs}}$ is equal to $\overline{V_o}$ over a long period of time, $\overline{V_{obs}}$ (Vavg$_n$ as shown in FIG. 3) is substituted for $\overline{V_o}$, and the $\overline{V_o}$ equation may be solved for $\overline{S_v}$ (step 92) as follows:

$$\overline{S_v} \approx \frac{\overline{V_{obs}} - V_f}{V_i - V_f}.$$

In a preferred embodiment, $S_v$ is based on both voltage $\overline{V_{obs}}$ (Vavg$_n$ shown in FIG. 3) as well as temperature.

Additionally, temperature is known to have a direct effect on the open-circuit voltage of the battery 36. Thus, a simple linear correction factor be used to compensation for temperature effects on the open-circuit voltage of the battery 36 in accordance with the following formula:

$$V'_{f,i} = V_{f,i} + b(T - T_o),$$

wherein $V'_{f,i}$ is a temperature-corrected value of voltage, b is a temperature compensation factor, T is a measured temperature, and $T_o$ is a reference temperature, such as 25° C. as applied to the two variables $V'_f$ and $V'_i$.

Thus, an adjusted avg Sv ($\overline{S'_v}$) based on both voltage Vn and temperature can be calculated and substituted for $\overline{S_v}$ (shown as Savg$_v$ in step 92 of FIG. 3) in accordance with the following equation:

$$\overline{S'_v} \approx \frac{\overline{V_{obs}} - V'_f}{V'_i - V'_f}$$

The closed integral approach is used to calculate $\overline{S_v}$ based on CAN-reported pack voltage and temperature. The algorithm generates a stack of SoC (assumed to represent the accumulated i$\Delta$t) of size M with the respective accumulated V$\Delta$t. If the initial SoC is seen after time $t_{min}$ but before $t_{max}$, the average value of the voltage is used to calculate state-of-charge, if a minimum time from start is reached. Each element of the stack is renewed after time greater than $t_{max}$ is observed, in order to keep a rolling total.

State of charge $S_n$ based on current flow is calculated for each interval of time dt, wherein Sn equal current times an interval of time dt (step 86). $S_n$ is based on current flowing into and out of the battery 36 during predefined increments of time dt that is reported from a current measuring device. The current measuring device may be a battery control module 50 that retrieves a total amount of current entering and leaving the battery 36 and that additionally operates to calculate a summation of each $S_n$ (sum(Sn)) shown in the summation step 82 of FIG. 3) in accordance with an amp-hour integration method. The sum (Sn) is calculated by summing the BCM reported current flowing into or out of the battery 36 during a predefined increments of time during a time $t_n$ of a hybrid cycle, step 86 for each time $t_n$ exceeding a predefined minimum amount of time $t_{min}$, but before $t_n$ exceeds $t_{max}$.

An average state of charge $\overline{S_n}$ (Savg$_n$ shown in FIG. 3) is determined in step 94 by dividing the sum (Sn) by a total length of time t.

The averaged value of $\overline{S_v}$ is then compared to the average of the BCM-reported state-of-charge $\overline{S_n}$ (step 98) after calculation of Vavg$_n$ (step 96), Savg$_v$ (step 94), Savg$_n$ (step 92).

An offset value Soffset may result between the state-of-charge calculated from voltage and temperature $\overline{S_v}$ to the state-of-charge calculated by amp-hour integration $\overline{S_n}$ due to factors such as sensor drift, battery age, or current-sensor noncompliance.

Thus, the Soffset is calculated to periodically correct the average amp-hour integrated state-of-charge $\overline{S_n}$ by subtracting the $\overline{S_v}$ from the $\overline{S_n}$ (step 102) when an absolute value of Soffset is greater than or exceeds a value defining an error band dSOC (step 100).

The method of the present invention defines a moving record of Sn(avg$_n$) and uses a plurality of past values of BCM-reported SOCs to determine if the battery is operating within the limits of the error band dSOC. A calculation of the voltage-based state of charge $\overline{S_v}$ is then carried out if the time elapsed is greater than a minimum time $t_{min}$ and less than a maximum time, $t_{max}$ (step 78) or if the absolute value of the difference between Sn(avg$_n$) and S(avg$_v$) do not exceed the error band dSOC (step 104).

From the foregoing, it should be appreciated that several embodiments of a system and method to control battery state of charge (SOC) for batteries installed in a hybrid vehicle.

While a preferred exemplary embodiment has been presented in the foregoing detailed description, it should be understood that a vast number of variations exist and this preferred exemplary embodiment is merely an example, and it is not intended to limit the scope, applicability or configuration of the invention in any way. Rather, the foregoing detailed description provides those of ordinary skill in the art with a convenient guide for implementing a preferred embodiment of the invention and various changes can be made in the function and arrangements of the exemplary embodiment without departing from the spirit and scope of the appended claims.

What is claimed is:

1. A method of calculating an accurate state of charge of a battery installed in an electric vehicle comprising the step of:

using an estimated average battery state of charge for the battery based on a long-term average open circuit battery voltage to check for accuracy of a measured state of charge based on current flowing into and out of the battery, wherein the long-term average open circuit battery voltage and a long-term average observed battery voltage are equal after a predefined minimum amount of time, Tmin has been exceeded wherein when Tmin has been exceeded, an average hysteresis and an average internal resistance each associated with the battery are negligible.

2. The method of claim 1, further comprising the step of; estimating the estimated average battery state of charge for a plurality of battery charge-discharge cycles based a long-term average open circuit voltage of the battery using closed integration, wherein the estimated average battery state of charge can be determined over a region of voltage linearity.

3. The method of claim 2, further comprising the steps of:
extrapolating an initial voltage value from the region of voltage linearity to a full state of charge;
extrapolating a final voltage value from the region of voltage linearity to an empty state of charge when the battery is completely discharged;
using the extrapolated initial and final voltage values to calculate the estimated average battery state of charge for battery charge-discharge cycles based on a long-term average open circuit voltage of the battery.

4. The method of claim 1, further comprising the step of:
calculating an average of the measured state of charged based on current flowing into and out of the battery using amp-hour integration.

5. The method of claim 1, further comprising the step of:
correcting the measured state of charge based on current flowing into and out of the battery when the measured state of charge based on current flowing into and out of the battery differs from the estimated average battery state of charge by a predefined amount.

6. The method of claim 1, wherein the estimated average battery state of charge for electric vehicles based on a long-term average battery voltage is affected by temperature.

7. The method of claim 6, further comprising the step of:
using a linear correction factor to compensate for any effects of temperature on the long-term average open circuit battery voltage.

8. A method of calculating an accurate state of charge of a battery installed in a hybrid vehicle comprising the step of:
calculating an offset value between a voltage-based average battery state of charge $Sv_{avg}$ based on a long-term average open circuit battery voltage and a current-based average state of charge $Sn_{avg}$ based on a summation of current flowing into and out of the battery when the two average battery state of charges $Sv_{avg}$ and $Sn_{avg}$ differ by an amount exceeding an acceptable error band, wherein a long-term average open circuit battery voltage and a long-term average observed battery voltage are equal after a predefined minimum amount of time Tmin has been exceeded, wherein when Tmin has been exceeded, an average hysteresis and an average internal resistance each associated with the battery are negligible are equal after a predefined minimum time, Tmin has elapsed.

9. The method of claim 8, further comprising the step of:
defining a moving record of a plurality of state of charges based on current flowing into and out of the battery using a plurality of past values of measured state of charges reported by a current measuring device over predefined intervals of time.

10. The method of claim 9, further comprising the steps of:
summing each of the plurality of state of charges based on current using a plurality of past values of measured state of charges reported by a current measuring device over predefined intervals of time; and
dividing the sum of each of the plurality of state of charges by a total time t.

11. The method of claim 9, wherein the current measuring device is a battery control module.

12. The method of claim 8, wherein the calculation of the voltage-based average state of charge $Sv_{avg}$ is performed if a time elapsed in a hybrid cycle ranges between a predefined minimum time and a predefined maximum time.

13. A method of calculating an accurate state of charge of a battery installed in a hybrid vehicle comprising the steps of:
calculating an average open circuit voltage to eliminate effects of hysteresis voltages and polarization of the battery that occur during a hybrid cycle;
using the average open circuit voltage to calculate an average, voltage-based state of charge of the battery, wherein the long-term average open circuit battery voltage and a long-term average observed battery voltage are equal after a predefined minimum amount of time Tmin has been exceeded, wherein when Tmin has been exceeded, an average hysteresis and an average internal resistance each associated with the battery are negligible are equal after a predefined minimum time, Tmin has elapsed;
comparing the calculated average voltage-based state of charge with a current-based average state of charge measured from current flowing into and out of the battery; and
correcting the current-based average state of charge when the average voltage-based state of charge differs from the average state of charge measured from current flowing into and out of the battery by a predefined amount.

14. The method of claim 13, further comprising the step of:
measuring a plurality of observed voltage values of the battery during predefined equal intervals of time, wherein each of the measured plurality of observed voltage values are a function of an associated open circuit voltage, an associated hysteresis voltage of an open circuit voltage, and an associated polarization value based on the battery current flowing into and out of battery and an internal resistance of the battery.

15. The method of claim 14, further comprising the step of:
averaging each of a plurality of hysteresis voltages measured during predefined equal intervals of time over a predefined total period of time t, wherein t ranges between a predefined minimum time and a predefined maximum time.

16. The method of claim 15, further comprising the step of:
setting the average of the plurality of hysteresis voltages equal to zero when time t has elapsed.

17. The method of claim 14, further comprising the step of:
averaging each of a plurality of polarization values measured in predefined equal intervals of time over a predefined period of time t ranging between a predefined minimum time and a predefined maximum time.

18. The method of claim 17, further comprising the step of:

setting the average of each of the plurality of polarization values equal to zero.

19. The method of claim 14, further comprising the step of:

averaging each of the measured plurality of observed voltage values during predefined equal intervals of time over a predefined period of time t ranging between a predefined minimum time and a predefined maximum time.

20. The method of claim 19, further comprising the step of:

setting the average of each of the measured plurality of observed voltage values equal to the average open circuit voltage of the battery.

21. A method of calculating an accurate state of charge of a battery installed in a hybrid vehicle comprising the steps of:

calculating a current-based average state of charge, wherein the current-based average state of charge is calculated using a current integral method;

calculating a voltage-based average state of charge, wherein the voltage-based average state of charge is based on an average observed voltage for a time period exceeding a predefined minimum time but before a predefined maximum time, wherein a long-term average open circuit battery voltage and a long-term average observed battery voltage are equal after a predefined minimum amount of time Tmin has been exceeded, wherein when Tmin has been exceeded, an average hysteresis and an average internal resistance each associated with the battery are negligible are equal after a predefined minimum time, Tmin has elapsed;

comparing each of the calculated current-based and voltage-based average state of charges to determine if an absolute value of difference between the two respective average state of charges is within an acceptable error band; and offsetting the calculated average current-based state of charge by the difference between the two respective average state of charges when the acceptable error band is exceeded to provide a more accurate average current-based state of charge.

22. The method of claim 21, wherein the step the calculated current-based average state of charge comprises the step of:

subtracting the calculated voltage-based average state of charge from the calculated current-based average state of charge.

\* \* \* \* \*